United States Patent

Hirokawa et al.

[11] Patent Number: 5,525,807
[45] Date of Patent: Jun. 11, 1996

[54] ION IMPLANTATION DEVICE

[75] Inventors: Suguru Hirokawa, Saijyou, Japan; Frank Sinclair, Quincy; Neil E. DeMario, Ipswich, both of Mass.

[73] Assignee: Eaton Corporation, Cleveland, Ohio

[21] Appl. No.: 465,420

[22] Filed: Jun. 5, 1995

Related U.S. Application Data

[63] Continuation-in-part of Ser. No. 458,354, Jun. 2, 1995.
[51] Int. Cl.⁶ .................................................. H01J 37/00
[52] U.S. Cl. .................... 250/492.21; 250/442.11
[58] Field of Search .................. 250/492.21, 492.2, 250/398, 397, 440.11, 442.11

[56] References Cited

U.S. PATENT DOCUMENTS

| | | | |
|---|---|---|---|
| 3,778,626 | 11/1973 | Robertson | 250/492.21 |
| 4,234,797 | 11/1980 | Ryding | 250/492.2 |
| 4,517,465 | 5/1985 | Gault et al. | 250/492.21 |
| 4,628,209 | 9/1986 | Wittkower | 250/492.21 |
| 4,733,091 | 3/1988 | Robinson et al. | 250/492.2 |

FOREIGN PATENT DOCUMENTS

| | | |
|---|---|---|
| 0458422 | 11/1991 | European Pat. Off. . |
| 6116746 | 4/1994 | Japan . |
| 9113457 | 5/1991 | WIPO . |

OTHER PUBLICATIONS

Patent Abstracts of Japan, vol. 7 No. 182 (E–192)[1327], 11 Aug. 1983 JP-A-58 087746 (Nippon Denki) 25 May 1983.

*Primary Examiner*—Jack I. Berman
*Assistant Examiner*—Kiet T. Nguyen
*Attorney, Agent, or Firm*—Watts, Hoffmann, Fisher & Heinke Co.

[57] ABSTRACT

An ion implantation device equipped with a high-speed driving device which causes rotation of the a disk that supports semiconductor wafers around it outer periphery. A center position of the disk is the axis of the rotation of the high speed rotation. A low-speed driving device causes relative movement of the disk in a radial direction. The ion implantation device further has a control circuit which calculates the movement speed of the aforementioned low-speed driving device with reference to different spacings between wafers about the outer periphery and the distance from the center of the disk to the ion implantation position, and controls said low speed scan speed so that ions are uniformly implanted into the aforementioned wafers.

9 Claims, 6 Drawing Sheets

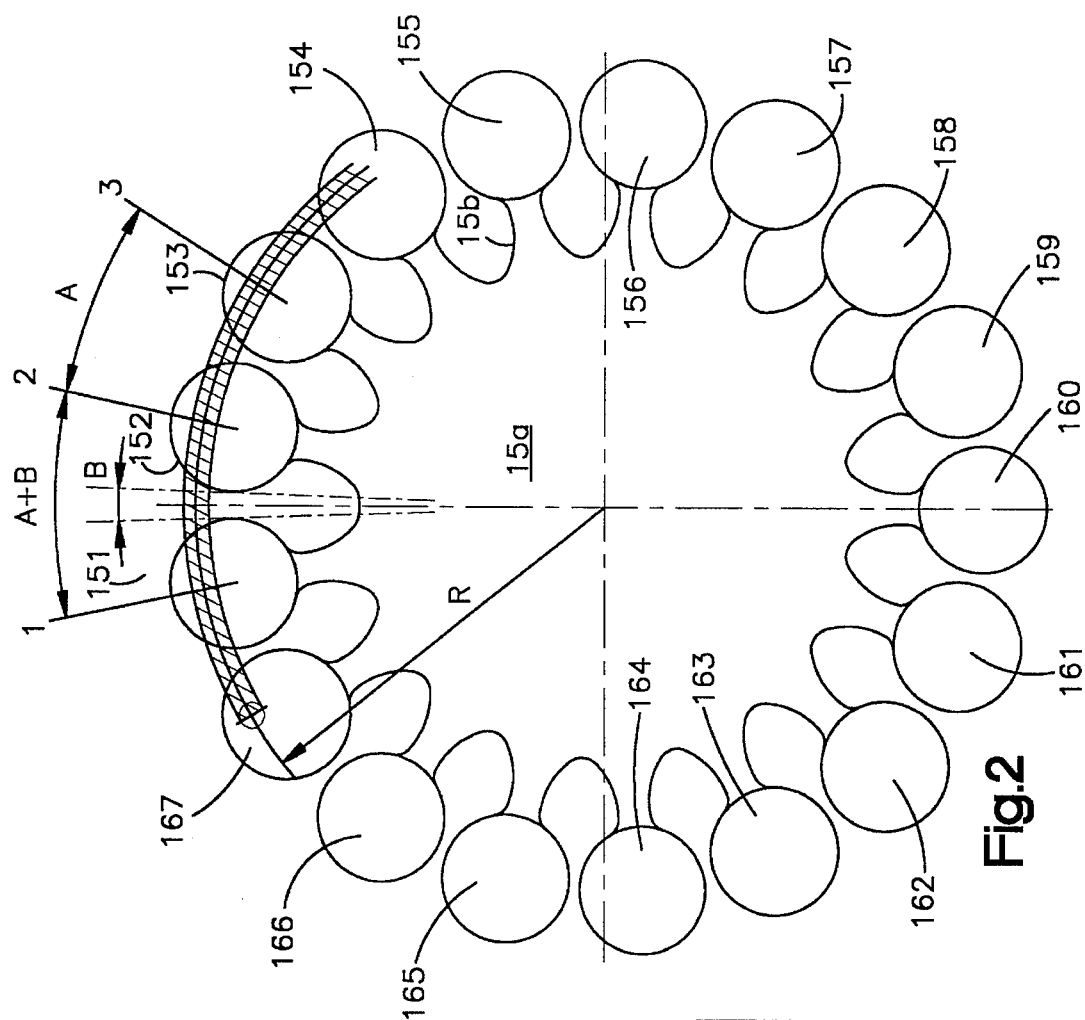
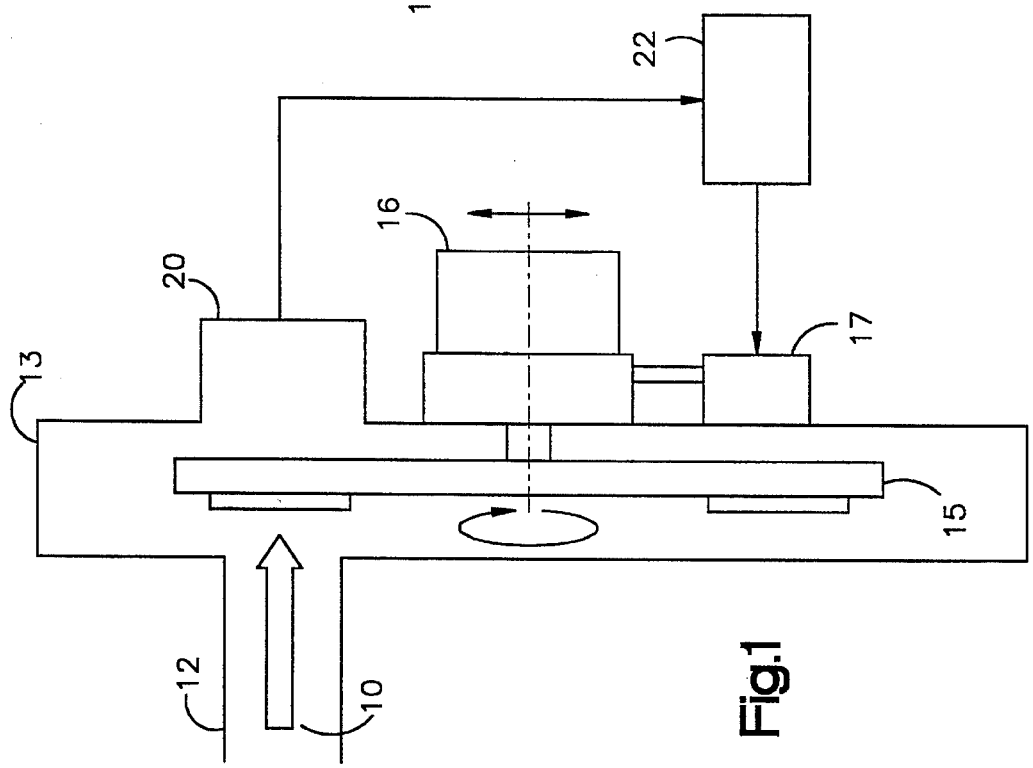
Fig.2
Fig.1

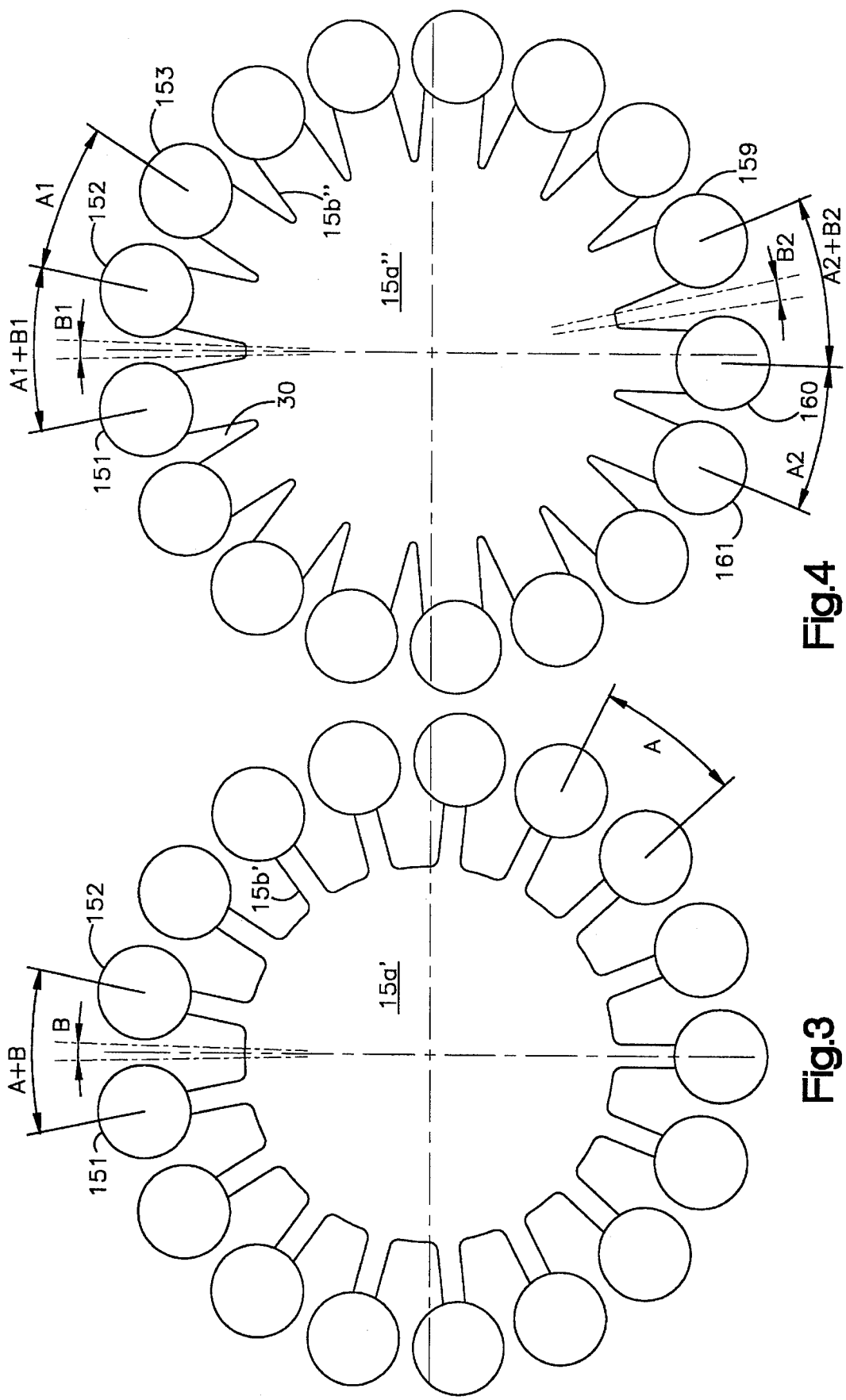

ION IMPLANTATION DEVICE

CROSS REFERENCE TO RELATED APPLICATION

The present application is a continuation in part of U.S. application Ser. No. 08/458,354 filed Jun. 2, 1995 entitled "AN ION IMPLANTATION DEVICE" to Suguru Hirokawa and Frank Sinclair (Attorney Docket No. 13-772) which is assigned to the assignee of the present application.

FIELD OF THE INVENTION

The present invention concerns an ion implantation device which implants charged particles, especially ions, into substrates such as semiconductor wafers.

BACKGROUND ART

Generally, ion implantation devices of this type are used to implant ions of a predetermined chemical species into semiconductor wafers in semiconductor manufacturing processes. Furthermore, such ion implantation devices include ion implantation devices with a so-called "mechanical scanning system" in which implantation is efficiently performed by a) positioning a multiple number of semiconductor wafers around the circumference of a rotation disk, b) causing said disk to rotate so that all of the semiconductor wafers are scanned at a high speed, and c) causing relative movement of the ion beam at a comparatively low speed in the radial direction of the rotating disk, so that the individual semiconductor wafers are scanned at a low speed.

Recently, in ion implantation devices, there has been a demand for an increase in the ion beam current in order to improve the productivity of semiconductor devices by shortening the ion implantation time. Hopes have been place in the above-mentioned ion implantation devices with mechanical scanning systems as ion implantation devices capable of handling such large-current ion beams.

However, in cases where a large-current ion beam is used, particles of impurities are created by sputtering which occurs as a result of parts other than the semiconductor wafers (e.g., the rotating disk) being irradiated by the ion beam. These impurity particles become mixed with the desired ions, and adhere to the semiconductor wafers, so that said semiconductor wafers become contaminated (below, this will be referred to as "contamination"). When impurity elements other than the desired ions thus become mixed with said ions and adhere to the wafers, the yield of semiconductor devices drops conspicuously.

Furthermore, it has also been indicated that in cases where the chemical species of ions being implanted is changed after certain ions have been implanted, contamination caused by the element previously being implanted (i.e., cross contamination) occurs.

Various methods have been proposed in order to prevent such contamination or cross contamination. For example, in Japanese Patent Application Kokai No. 61-116746, an ion implantation device is disclosed in which contamination caused by sputtering of the rotating disk is prevented by constructing a scanning arm assembly in which wafer attachment paddles are installed at equal intervals in a circular arrangement around a central hub, and wafers are attached to the tips of said paddles. This ion implantation device is constructed so that the scanning arm assembly is caused to rotate at high speed, and so that a cycloidal movement is performed at a low speed about the axis of the bottom part of the scanning arm assembly.

In such a construction, since wafer attachment paddles are installed as a disk, the portions of said paddles that are exposed to the ion beam can be reduced, so that the portions of the disk exposed to the ion beam can be greatly reduced; furthermore, as a result of the aforementioned cycloidal movement, the entire surface of each wafer can be irradiated with the ion beam.

However, in the above-mentioned ion implantation device using wafer attachment paddles, although the speed of the aforementioned cycloidal movement is controlled so that said speed is proportional to the distance from the axis of rotation, no consideration is given to fluctuations where there are changes in the ion beam current during the aforementioned low-speed cylocidal movement, the device cannot adequately respond to said changes; as a result, ions cannot be uniformly implanted.

One object of the present invention is to provide an ion implantation device a) which can reduce sputtering caused by exposure of the disk to the ion beam, and b) which can adequately respond to changes in the ion beam current during ion beam implantation.

DISCLOSURE OF THE INVENTION

The present invention provides an ion implantation device which is characterized by the fact that in an ion implantation device equipped with a disk which allows a plurality of wafers to be positioned at intervals around the circumference of said disk, said disk is constructed so that there is at least one place on said disk where the spacing between the aforementioned wafers in different from the spacing elsewhere.

In the above construction, respective ion beam charges passing between the wafers (which are separated from each other by different spacing) are successively compared over time, so that fluctuations in the ion beam current are detected. Furthermore, the speed of the aforementioned low*speed scanning in the radial direction of the disk with respect to the axis of rotation is controlled so that even if there are fluctuations in the ion beam current during ion beam implantation, ions can be implanted into the respective semiconductor wafers in a substantially uniform manner.

A presently preferred embodiment of the invention includes a support disk positioned within the implantation chamber that supports a plurality of wafers at spaced intervals around the circumference of said support disk. The support disk is constructed so that there is at least one place on said disk where the spacing between the aforementioned wafers is different from the spacing elsewhere about the circumference. A motor rotates the support disk with respect to the ion beam that enters the chamber to cause wafers rotate through the ion beam. A sensor monitors ion beam current of the ion beam as the ion beam impinges on the disk.

The data from the sensor is used to control a scan device for moving the center of the support disk along a travel path to cause an entire surface of the wafers to be treated by the ion beam. A circuit controls the speed of movement of the support disk along the travel path by first monitoring beam current during two different time intervals that include a time period the ion beam is passing through the region of different spacing, then determining charge reaching the sensor during the two intervals, and finally adjusting the speed of the disk along the travel path.

BRIEF DESCRIPTION OF THE DRAWINGS

FIG. 1 is a schematic diagram which illustrates the overall construction of the ion implantation device of the present invention;

FIG. 2 is a plan view which illustrates the disk used (in one embodiment of the present invention) in the ion implantation device shown in FIG. 1;

FIG. 3 is a plan view which illustrates a modification of the disk shown in FIG. 2;

FIG. 4 is a plan view which illustrates the disk used in another embodiment of the present invention;

BEST MODE FOR PRACTICING THE INVENTION

Figure 6:
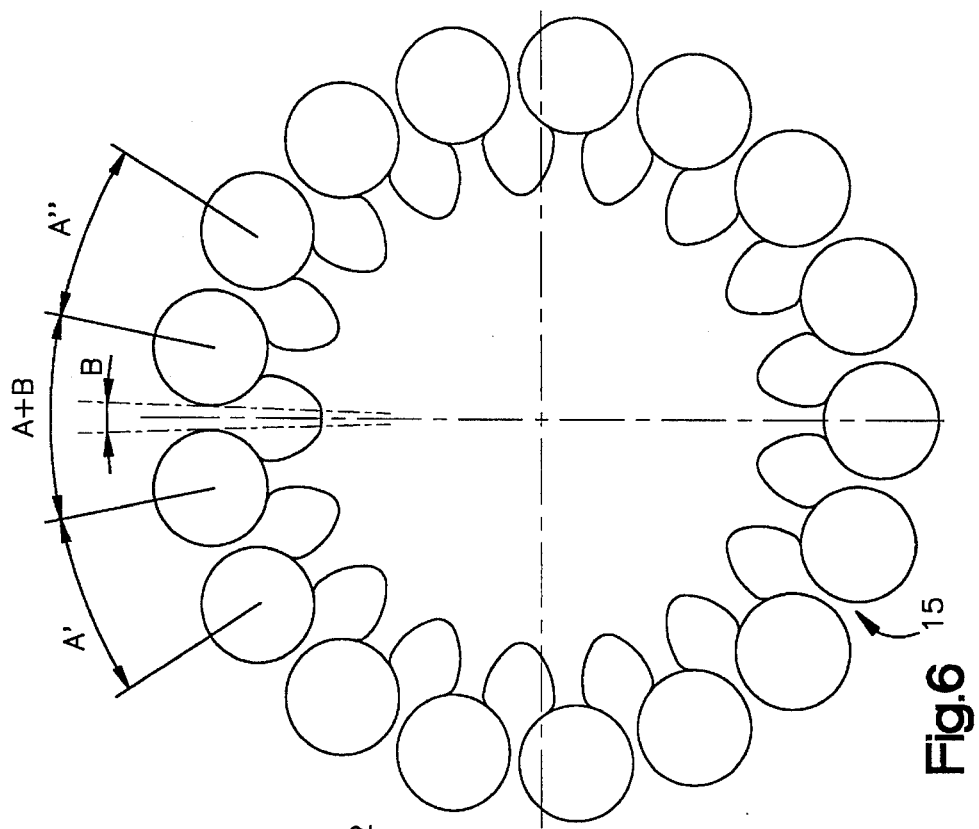
FIG. 6 is a plan view which illustrates the disk used in still another embodiment of the present invention.

Below, an ion implantation device constituting one embodiment of the present invention will be described with reference to the attached figures. Referring to FIG. 1, the ion implantation device of this embodiment has a guide chamber 12 which guides an ion beam 10 from an ion source (not shown in the figures), and a treatment chamber 13 in which the ion beam 10 from the guide chamber 12 is implanted into semiconductor wafers.

A disk 15 constructed according to the present invention (described in detail later) is installed inside the treatment chamber 13 shown in the figures. This disk 15 is caused to rotate at a high speed about a rotating shaft (installed at the center of said disk 15) by a high speed scanning driving mechanism 16. As a result of this rotation, the semiconductor wafers positioned around the circumference of the disk 15 are scanned at a high speed; furthermore, said wafers are also scanned at a low speed in the vertical direction in FIG. 1. Accordingly, a low-speed scanning driving mechanism 17 is installed so that the individual semiconductor wafers can also be scanned at a low speed in the radial direction from the axis of rotation. Here, a mechanism whose low-speed scanning operation can be controlled is used as the aforementioned low-speed scanning driving mechanism; meanwhile, the driving mechanism used for high-speed scanning may be an ordinary driving mechanism.

A beam current measuring device referred to commonly as a Faraday cup 20 is positioned behind the disk 15 installed in the treatment chamber 13 (i.e., on the opposite side of said disk from the side irradiated by the ion beam), and the charge of the ion beam passing through the disk 15 is measured by this beam current measuring device 20. Since this beam current measuring device 20 may consist of a commonly used device, a detailed description of said device 20 is omitted here.

The above-mentioned beam current measuring device 20 is connected to a control part 22; this control part 22 performs predetermined calculations based on the charge detected, and controls the scanning speed of the low-speed scanning driving mechanism 17 so that ions are uniformly implanted.

Referring now to FIG. 2 as well, a multiple number of semiconductor wafer attachment parts 151–167 used for wafer attachment, i.e., 17 wafer attachment parts in the case of this embodiment (hereafter referred to collectively as 15n) are installed around the outside circumference of the disk 15 in the present embodiment, and respective semiconductor wafers are placed on each of these attachment parts 15n. Furthermore, the central part 15a of the disk 15 and the semiconductor wafer attachment parts 15n, are connected by bridge parts 15b which have a narrower width than the semiconductor wafer attachment parts 15n, so that the area of the disk 15 that is exposed to the ion beam is reduced.

Furthermore, in the example shown in the figures, the spacing between the semiconductor wafer attachment parts 151, 152 is set so that it is wider than the respective spacings between the other attachment parts (e.g. 152, 153). This means that the spacing between the semiconductor wafers attached to the attachment parts 151, 152 is wider than the respective spacings between the semiconductor wafers attached to the other attachment parts. Here, the conditions other than the aforementioned spacing, i.e. the wafer size and method of support, etc. are the same for all of the wafer attachment parts.

In the case of a disk 15 constructed as described above, the bridge parts 15b are extremely narrow; accordingly, the area exposed to the ion beam is small, so that contamination caused by exposure of the disk 15 to the ion beam can be greatly reduced.

Meanwhile, the angle between the center of the attachment part 151 and the center of the attachment part 152 can be expressed as A+B, where A is the angle between the center of the attachment part 152 and the center of the adjacent attachment part 153, and B is the angle of a space between the attachment parts 151, 152.

In this case, assuming that the center of the ion beam is located at a distance of R from the center of the disk 15, the area indicated by shading in FIG. 2 is irradiated by the ion beam. Accordingly, the charge measured by the beam current measuring device 20 installed on the downstream side of the disk 15 while the center of the ion beam passes from the center position 1 of the attachment part 151 to the center position 2 of the attachment part 152 is measured as the charge of the ion beam passing through the gap (i.e., the spacing) between the attachment parts 151, 152. Here, the charge measured by the beam current measuring device 20 is designated as QA+B.

Next, when the charge occurring while the center of the ion beam passes from the center position 2 of the attachment part 152 to the center position 3 of the attachment part 153 is similarly measured by the beam current measuring device 120, said charge is measured as the charge passing through the gap that defines the spacing of the attachment parts 152, 153. The charge measured in this case is designated as QA.

It is seen that the charge of the beam passing through the fan-shaped portion with an angle of B can be determined by calculating QA+B−QA under the conditions described above. This means that changes in the ion beam current during ion implantation can be detected; consequently, the charge of the ions implanted into the semiconductor wafers 25 attached to the respective attachment parts 15n can be maintained at a substantially constant level by controlling the speed of movement of the disk 15 in the radial direction, i.e., the scanning speed, in accordance with the aforementioned changes. More concretely, where V is the aforementioned speed of movement in the radial direction, said movement speed V can be expressed as V=K(QA+B−QA)/R (here, K is a proportionality constant). If the movement speed V is calculated by the control part 22 (shown in FIG. 1) using this formula, and the low-speed scanning driving mechanism is controlled in accordance with the result obtained, ions can be uniformly implanted.

It is sufficient if the above-mentioned charge measurement and control action are performed for each revolution of the disk. In such a case, any discrepancies in timing are cancelled.

Referring to FIG. 3, the disk 15 in a modification of the embodiment shown in FIG. 1 differs from the disk shown in FIG. 2 in that the center part 15a' of the disk and the attachment parts 15n are connected by rectangular bridge parts 15b'. As in FIG. 2, two of the attachment parts installed in specified positions (attachment parts 151, 152 in FIG. 3) are positioned with a spacing of angle B; as a result, the angle between the center positions of these specified attachment parts 151, 152 can be expressed as A+B, and thus different from the angle A between the center positions of the other attachment parts.

In this case, as in the case of FIG. 2, the portion of the disk 15 that is exposed to the ion beam can be minimized; furthermore, the speed of movement of the disk 15 in the radial direction, i.e., the scanning speed, can be adjusted in accordance with changes in the ion beam current so that ions are uniformly implanted into the semiconductor wafers attached to the attachment parts 15n.

Referring to FIG. 4, the disk in another embodiment of the present invention is constructed so that adjacent attachment parts 15n are separated from each other by notches (i.e., valleys) 30, with a stipulated spacing between each pair of adjacent attachment parts 15n. Here, the spacing between attachment parts 15n is substantially the same as the spacing between the semiconductor wafers. In this example, the bridge parts 15b" which connect the attachment parts 15n with the central part 15a" of the disk have a tapered shape which becomes slightly wider toward the central part 15a" of the disk.

In FIG. 4, the angular spacing determined by the notch between the attachment parts 151, 152 is set at B1, and the angular spacing determined by the notch between the attachment parts 159, 160 is set at B2. Meanwhile, the angular spacing between the remaining attachment parts is set at a value which is smaller than the aforementioned angular spacings B1, B2.

Furthermore, in a case where the angle between the center position of the attachment part 152 and the center position of the adjacent attachment part 153 is set at A1, and the angle between the center position of the attachment part 160 and the center position of the adjacent attachment part 161 is set to A2, the angle between the attachment parts 151, 152 can be expressed as A1+B1, and the angle between the attachment parts 159, 160 can be expressed as A2+B2.

In this case, as in the case of FIG. 2, the charges for the angles (A1+B1) and (A2+B2) can be expressed as the ion beam charges QA1+B1 and QA2+B2 passing through the respective notches. Accordingly, the scanning speed V at various locations in the radial direction can be expressed as follows (in a case where the ion beam is located at a position of radius R):

$$V+K(QAN+BN-QAN)/R \qquad (eq\ 1.)$$

(Here, N indicates 1 or 2) As is also clear from the above equation, two or more notches with different angular spacings may be formed. Furthermore, the mean value of the charge may be used for the control of the scanning speed V.

Figure 5:
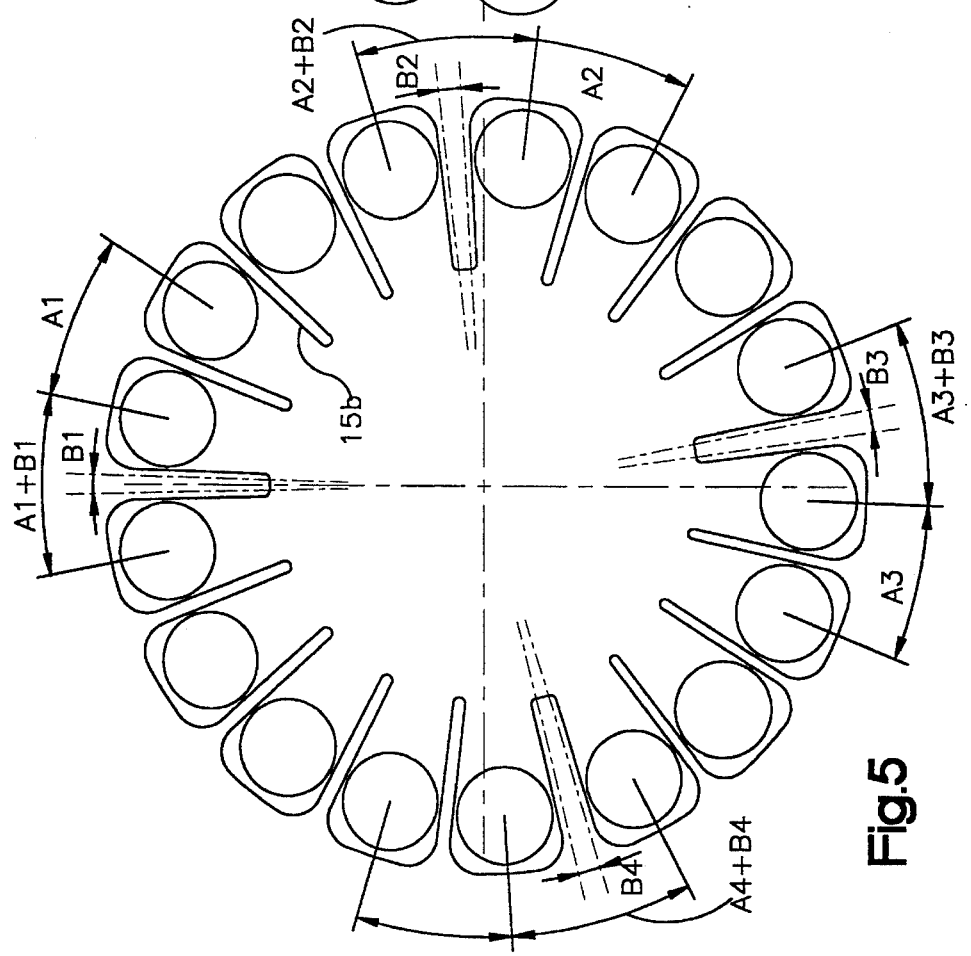
FIG. 5 is a plan view which illustrates the disk used in still another embodiment of the present invention.

Referring to FIG. 5, the disk 15 in still another embodiment of the present invention has wide notches in four place, and has tapered bridge parts 15b that widen outward in the radial direction from the central part of the disk. Furthermore, these bridge parts 15b are formed as integral units with the attachment parts 15n, and semiconductor wafers 25 are placed on said attachment parts 15n. Here, the spacings between the centers of the attachment parts adjacent to the respective wide notches are expressed by the angles A1, A2, A3 and A4. Assuming that the four notches have respective angles of B1, B2, B3, and B4, the spacings between the centers of the respective attachment parts located on either side of the wide notches can be expressed by the angles (A1+B1), (A2+B2), (A3+B3) and (A4+B4). The aforementioned equation 1 is also valid in this example; accordingly, ions can be uniformly implanted into the semiconductor wafers 25 by controlling the scanning speed V.

Referring to FIG. 6, a wide notch which has an angle of B, and ordinary notches which have angles smaller than that of the wide notch, are formed in the disk 15 of still another embodiment of the present invention. In this case, the scanning speed V can be controlled using the following equation (where A is the angle between the semiconductor wafers on either side of the ordinary notches, A+B is the angle between the semiconductor wafers on either side of the wide notch, and QA(R−ΔR), QA(R+ΔR) and QA+B(R) are the charges passing through the respective notches);

$$V=K(QA+B(R)-(QA(R-\Delta R)+QA(R+\Delta R))/2)/R \qquad (Eq\ 2.)$$

As is clear from Equation 2 as well, the shift (ΔR) in the radial position caused by low-speed scanning (which is ordinarily ignored) can be considered by subtracting the mean value of the charges passing through adjacent notches from the charge passing through the wide notch, so that ions can be implanted into the respective semiconductor wafers 25 more accurately.

Figure 7A:
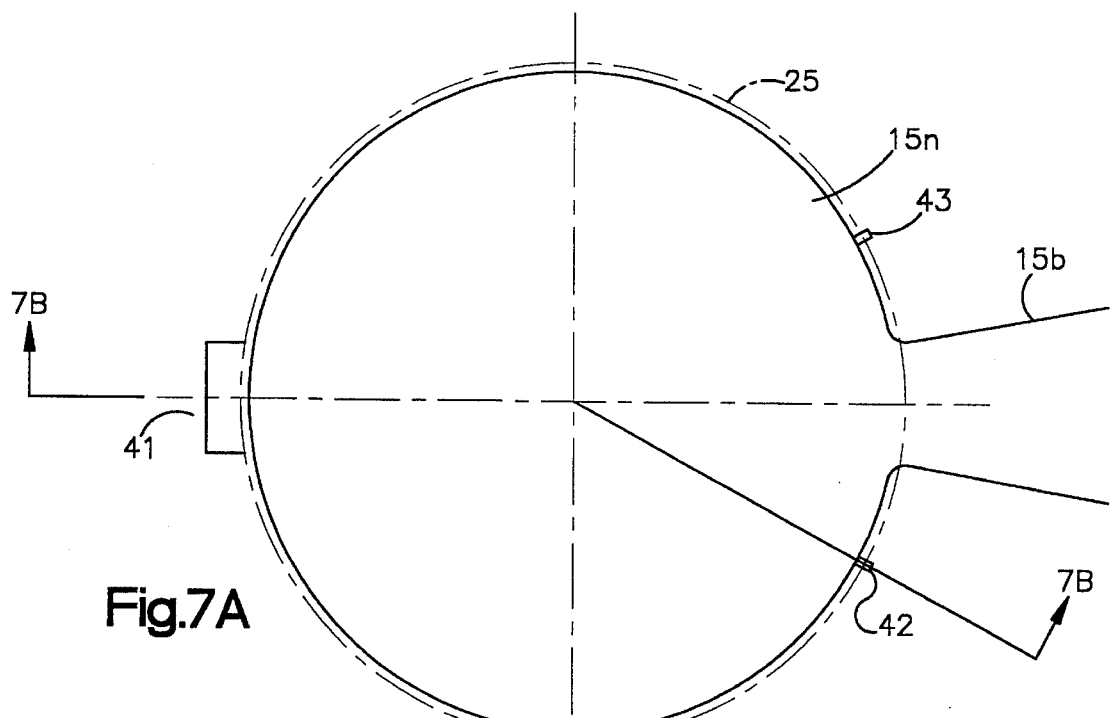
FIG. 7A is a plan view which illustrates one of the semiconductor wafer attachment parts used in the present invention.
Figure 7B:
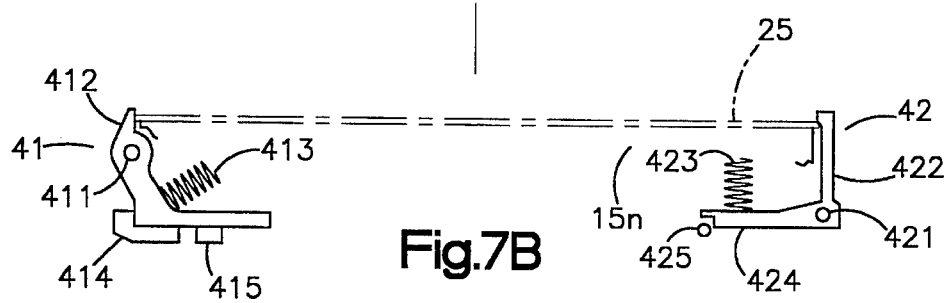
FIG. 7B is a sectional view as seen from the plane B—B of FIG. 7A.

FIGS. 7A and 7B illustrate the construction of a clamping part used to support the semiconductor wafers on the disks of the respective embodiments of the present invention described above. As is clear from FIG. 7A, a first clamp 41 which supports the semiconductor wafer 25 against the centrifugal force caused by rotation is installed on the outer circumference of each attachment part, and second and third clamps 42, 43 are installed on the inner circumference. Here, the second and third clamps 42, 43 have the same structure; accordingly, on the second clamp 42 will be described below. As is shown in FIG. 7B, the first clamp 41 has a rotation shaft 411 which is fastened to the attachment part 15n, and a fastening pawl 412 which extends upward from the rotating shaft 411. This fastening pawl 412 contacts the circumference of the semiconductor wafer 25, and supports the wafer 25 so that said wafer 25 is not pushed outward by centrifugal force. Furthermore, the portion of the first clamp 41 that extends downward is fastened to the attachment part by a compression spring 413, so that said spring 413 drives the first clamp 41 in the clockwise direction in FIG. 7B.

Moreover, a weight 414 is attached to the portion of the first clamp 41 that extends horizontally, and a stopper 415 is installed in front of the weight 414.

Meanwhile, in the case of the second damp 42, there is no need to consider the effects of centrifugal force. Accordingly, this clamp 42 has a simplified structure compared to that of the first clamp 41. Here, said clamp 42 is equipped with a moveable member 422 which can rotate about a rotating shaft 421 supported on the attachment part 15n, and an arm 424 which is attached to the attachment part 15n by a compression spring 423. A stopper 425 is installed at the inside edge part of the arm 424; this stopper 425 prevents the arm 424 from pivoting into an undesired position when no wafer 25 is attached.

The semiconductor wafer 25 is retained from the sides by the first through third clamps constructed as described above, so that said semiconductor wafer 25 is clamped to the surface of the attachment part 15n.

In the present invention, a disk which allows a plurality of wafers to be positioned at a prescribed spacing around the circumference of said disk is constructed so that there is at least one place on said disk where the spacing between wafers in different from the spacing elsewhere. As a result, the area of the disk that is exposed to the ion beam is reduced, and contamination caused by undesired sputtering can be prevented. Furthermore, fluctuations in the ion beam current are detected from the ion beam charges passing through the aforementioned areas with different spacing, and the rate of low-speed scanning is controlled in accordance with these detection results, so that ions can be uniformly implanted into the semiconductor wafers.

Figure 8:
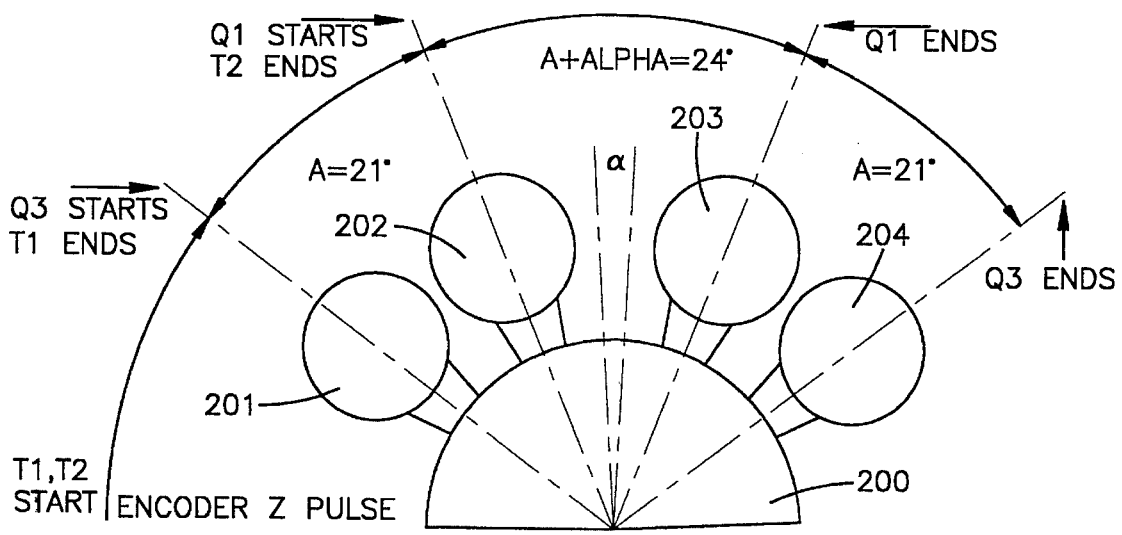
FIG. 8 is a partial schematic of the ion beam implantation system of FIG. 6 showing the sequence of beam current monitoring for use in controlling speed of movement of a wafer support disk.
Figure 9:
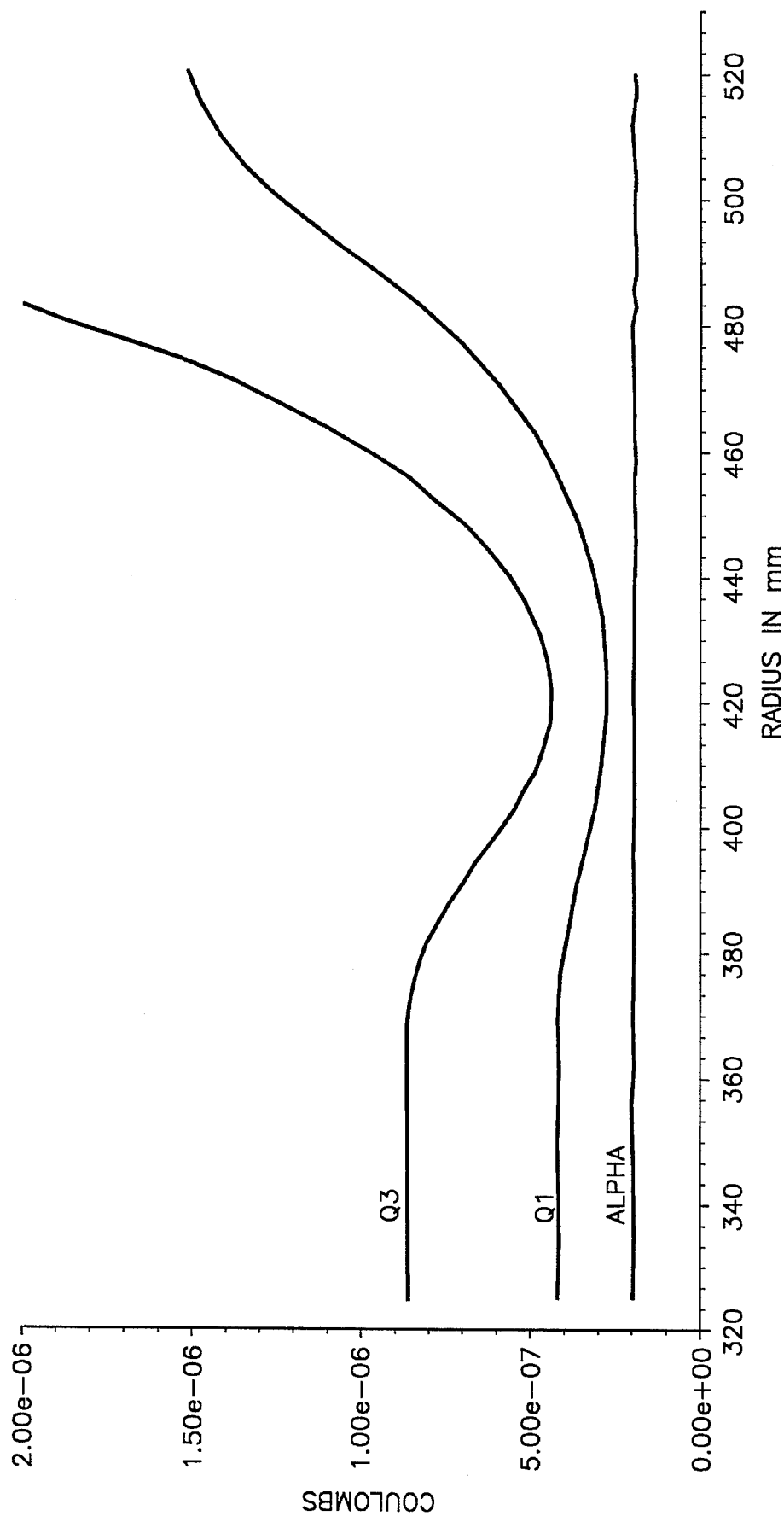
FIG. 9 is a graph showing a function relation between charge measurements as a function of radial location for the support disk.
Figure 10:
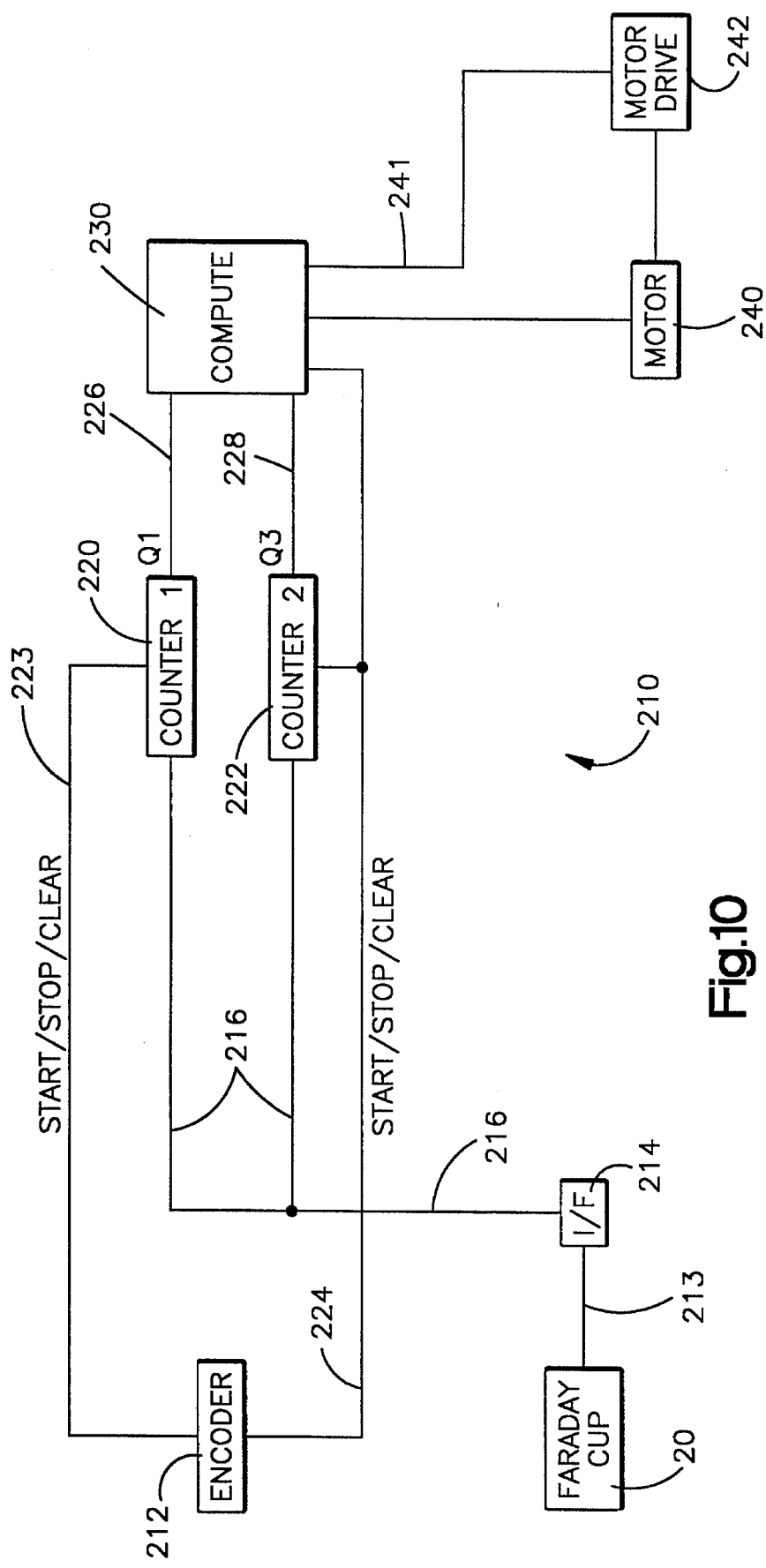
FIG. 10 is a block diagram of electronic circuitry for controlling the speed of movement of the support disk shown in FIG. 8.

Turning now to FIGS. 8–10, an alternate method is disclosed for calculating the desired speed V at which the disk 15 is moved in the radial direction by the low speed scanning mechanism 17. A nominal speed of rotation for the disk 15 during ion implantation is 20 revolutions per second. The number of back and forth traversals of the disk by the low speed scanning mechanism during one implant can be selected to be in a range from a few to many hundred with 200 being representative.

If the ion beam intensity could be maintained at a constant value, determining an appropriate instantaneous speed for the low speed scanning mechanism during the back and forth traversals would be straightforward. To assure proper implantation intensity, the instantaneous speed V in a radial direction would be a constant divided by the radius or distance from the center of the spinning disk to the region on the disk the beam 10 strikes the wafers.

Variations in beam intensity are sensed by apparatus particularly suited for the wafer support structure shown in FIG. 8 to control the rate at which the low speed scanning mechanism 17 moves the disk 15 back and forth in the radial direction. The instantaneous speed must be adjusted to be proportional to the instantaneous beam current divided by the radius. In equation form:

$$V(\text{instantaneous}) = K(\text{Current})/R \qquad (\text{Eq. 3})$$

FIG. 8 illustrates a partial view of a disk 200 similar to the disk 15 shown in FIG. 6 in the region of four pedestals 201–204 that support four semiconductor wafers. Two pedestals 202, 203 are spaced apart by an amount that is greater than a spacing between other adjacent pedestals around the circumference of the disk. In one embodiment of the invention the increased spacing, alpha is 3 degrees. By integrating beam current from the Faraday Cup 20 during two different time intervals that both include the time interval the beam scans through the region between the two pedestals 202, 203 an accurate indication of the beam current is obtained.

The ion implantation control 22 includes a circuit 210 (FIG. 10) that includes a rotary drive encoder 212 having two timers T1, T2 that are implemented using an AMD9513 integrated circuit. An output 213 from the Faraday Cup 20 represents a signal directly proportional to beam current. When this signal is integrated over time, one has a signal proportional to the beam charge. By starting two beam current integrators at the points labeled 'Q3 starts' and 'Q1 starts' (FIG. 8) and stopping the integrators at the points labeled 'Q3 ends' and 'Q1 ends', one has a measure of the charge striking the Faraday cup during two intervals that include the virtual slot alpha.

The encoder 212 monitors a timing mark and produces a timer pulse that starts two timers T1, T2 when the mark passes the encoder 212. When the timer T1 times out the beam 100 has reached the center of the wafer support 201 and a first charge monitoring interval begins. The second timing interval begins when the beam passes a center of the next wafer support 202.

The following mathematical relations govern the measured charge during the two time intervals the charge integrators are gathering data:

$$Q3 = (\text{CONSTANT})(3A + \text{alpha}) \qquad (\text{eq. 4})$$

$$Q1 = (\text{CONSTAN})(A + \text{alpha}) \qquad (\text{eq. 5})$$

where the CONSTANT is a proportionality constant and the A and alpha are the angles labeled in FIG. 8 and Q3 and Q1 are charges of the ion beam striking the Faraday cup during the two charge measuring intervals. One can solve for alpha in these equations with the knowledge that the correct instantaneous speed V can be expressed as:

$$V = K(\text{alpha})/R \qquad (\text{eq. 6)},$$

where $$\text{alpha} = (3Q1 - Q3)/2 \qquad (\text{eq. 7})$$

Turning to FIG. 9, one sees that while both Q1 and Q3 have non-constant functional relations with respect to the radius R, alpha is a constant with respect to the radius R. The value of alpha is directly related to beam current, thus allowing the equation 6 relation to be used to control the linear scan velocity.

FIG. 10 is a schematic diagram of the components of the circuit 210 used to calculate alpha on an essentially real time basis. The circuit 210 includes an input for monitoring the instantaneous current signal output 213 from the Faraday cup 20. These currents are converted by an analog-to-digital converter 214 to an oscillating signal output 216 whose frequency changes as a function of the instantaneous current sensed by the Faraday cup 20.

The signal output 216 from the analog-to-digital converter 214 is input to two counters 220, 222 having control inputs 224, 226 coupled to the encoder circuit 212. The encoder circuit 212 clears the counters 220, 222 at appropriate start times as indicated in FIG. 8 and sends a stop signal at appropriate times that causes the counters to stop counting the alternating signals from the analog-to-digital converter 214.

Signal outputs 228, 229 from the two counters 220, 222 corresponding to the charge striking the Faraday Cup 20 during the intervals depicted in FIG. 8 are coupled to a processor 230 that calculates the value of alpha based on Q1 and Q3. A signal fed back from a reversible d.c. scan motor 240 is input to the processor 230 to indicate the linear scan position and from this value a velocity output signal 241 is coupled to a motor controller 232 which causes the low speed scan mechanism to move the disk. In a preferred embodiment of the invention the low speed scan is accomplished by the reversible D.C. motor 240 that rotates a screw actuator that moves the disk back and forth along a linear travel path.

The control 22 is able to calculate the values for Q1 and Q3 in an interval of about 50 microseconds. This is fast enough that the speed of movement for the motor 240 is updated every revolution of the spinning disk.

A preferred embodiment of the present invention has been described with a degree of particularity. It is the intent that the invention include all modifications and alterations from the disclosed design falling within the spirit and scope of the appended claims.

We claim:

1. Apparatus for use in an ion implantation system having an ion source for directing an ion beam to enter an implantation chamber for implanting wafers comprising:

a support positioned within the implantation chamber that supports a plurality of wafers at circumferentially spaced intervals around the circumference of said support, said support constructed so that there is at least one place around the circumference said support provides a non-uniform spacing interval between the aforementioned wafers that is different from a spacing interval elsewhere about the circumference;

a motor for rotating the support about a rotation axis with respect to the ion beam entering the implantation chamber to cause wafers to intercept the ion beam;

a sensor for monitoring ion beam current of the ion beam entering the implantation chamber that passes the support and attached wafers;

a scan device for moving the support along a travel path to cause an entire surface of the wafers attached to the support to be treated by the ion beam; and a control circuit for controlling movement of the support along the travel path comprising a circuit for monitoring beam current during two different time intervals that include a time period the ion beam is passing through the region of the non-uniform spacing interval between wafers, determining charge reaching the sensor during the two different time intervals, and controlling the speed of movement of the support along the travel path.

2. The apparatus of claim 1 where the control circuit updates the speed of movement along the travel path during each revolution of the support.

3. The apparatus of claim 1 where the circuit for monitoring beam current includes an encoder circuit for monitoring the rotation of the support and supplying timing signals related to the orientation of the support and further comprises first and second timing circuits responsive to the encoder circuit for determining the charge during the two different time intervals.

4. The apparatus of claim 3 wherein the control circuit comprises means for computing an instantaneous speed along the travel path that is directly proportional to a computed value that is independent of a distance R between the axis of rotation of the support and a region of contact between the ion beam and the wafers connected to the support.

5. The apparatus of claim 4 wherein a first of the time intervals corresponds to the time for the beam to sweep from a center of a first wafer and then across second and third wafers spaced by the non-uniform interval to a center of a fourth wafer and wherein a second time interval corresponds to the time it takes the beam to sweep across centers of the second and third wafers and wherein the computed value is equal to the quantity (3 Q1–Q3)/2, where the value of Q1 is a charge impinging on the sensor during the second of said two different time intervals and the value of Q3 is a charge impinging on the sensor during the first of said two different time intervals.

6. The apparatus of claim 1 wherein the scan device comprises a reversible electric motor and linear actuator coupled to the support for moving the support along a linear travel path.

7. A method for use with an ion implantation system having a source for directing an ion beam to enter an implantation chamber for implanting wafers comprising the steps of:

positioning a plurality of wafers at spaced intervals around the circumference of a support disk within the implantation chamber so that a spacing between the aforementioned wafers is different at one location from the spacing elsewhere about the circumference;

rotating the support disk with respect to the ion beam that enters the chamber to cause wafers pass through the ion beam;

positioning a sensor for monitoring ion beam current of the ion beam behind the support disk to monitor ion beam current as the beam passes through spaces between wafers;

mounting the support disk for movement along a travel path to cause an entire surface of the wafers to be treated by the ion beam; and controlling movement of the support disk along the travel path by monitoring beam current during two different time intervals that include a time period the ion beam is passing through the region of different spacing, determining charge reaching the sensor during the two different time intervals, and controlling the speed of movement of the disk along the travel path based on the charge sensed during the two intervals.

8. The method of claim 7 wherein the step of monitoring beam current and determining the charge reaching the sensor during the two intervals is performed during each rotation of the disk for a given implantation.

9. The method of claim 7 wherein the step of controlling the speed is performed by monitoring charge during a first time interval corresponding to the time for the beam to sweep from a center of a first wafer and then across second and third wafers spaced by the non-uniform interval to a center of a fourth wafer and monitoring charge during a second time interval corresponding to the time it takes the beam to sweep across centers of the second and third wafers and computing a value of (3Q1–Q3)/2, where the value of Q1 is a charge impinging on the sensor during the second of said two different time intervals and the value of Q3 is a charge impinging on the sensor during the first of said two different time intervals and making the instantaneous speed proportional to this quantity and inversely proportional to a distance between a rotation axis of the support disk and a region of contact between the ion beam and the wafers attached to the support disk.

* * * * *